US008981508B2

(12) United States Patent
Franke

(10) Patent No.: US 8,981,508 B2
(45) Date of Patent: Mar. 17, 2015

(54) MAGNETIC FIELD SENSOR

(71) Applicant: Micronas GmbH, Freiburg (DE)

(72) Inventor: Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 14/101,887

(22) Filed: Dec. 10, 2013

(65) Prior Publication Data

US 2014/0159178 A1 Jun. 12, 2014

Related U.S. Application Data

(60) Provisional application No. 61/735,644, filed on Dec. 11, 2012.

(30) Foreign Application Priority Data

Dec. 10, 2012 (DE) .................. 10 2012 024 062

(51) Int. Cl.
*H01L 29/82* (2006.01)
*H01L 43/04* (2006.01)
*H01L 43/06* (2006.01)

(52) U.S. Cl.
CPC .............. *H01L 43/04* (2013.01); *H01L 43/065* (2013.01)
USPC ........... 257/427; 257/421; 257/422; 257/426; 257/E29.323; 438/3; 365/157; 365/158; 360/324; 360/324.2; 360/326

(58) Field of Classification Search
USPC ...................... 257/421–427, E29.323; 438/3; 365/157–158; 360/324–326, 313
See application file for complete search history.

(56) References Cited

U.S. PATENT DOCUMENTS

| 4,141,026 | A | * | 2/1979 | Bate et al. ...................... 257/427 |
| 5,162,886 | A | * | 11/1992 | Nishibayashi et al. ....... 257/421 |
| 5,850,624 | A | | 12/1998 | Gard et al. |
| 6,630,882 | B1 | * | 10/2003 | Heremans et al. ........... 338/32 H |
| 2004/0155644 | A1 | * | 8/2004 | Stauth et al. ............... 324/117 R |
| 2005/0086794 | A1 | * | 4/2005 | Fukunaka et al. ......... 29/603.01 |
| 2005/0231197 | A1 | | 10/2005 | Reininger et al. |
| 2006/0097715 | A1 | | 5/2006 | Oohira et al. |
| 2011/0037464 | A1 | | 2/2011 | Gurney et al. |
| 2012/0200290 | A1 | * | 8/2012 | Ausserlechner .............. 324/251 |

FOREIGN PATENT DOCUMENTS

| CN | 102 185 099 A | 9/2011 |
| CN | 102 263 121 A | 11/2011 |
| DE | 202 11 518 U1 | 10/2002 |
| DE | 10 2005 051 306 A1 | 6/2006 |

* cited by examiner

*Primary Examiner* — Jami M Valentine
(74) *Attorney, Agent, or Firm* — Muncy, Geissler, Olds & Lowe, P.C.

(57) ABSTRACT

A magnetic field sensor having a support with a top side and a bottom side, whereby a Hall plate is provided on the top side of the support and the Hall plate comprises a carbon-containing layer.

14 Claims, 1 Drawing Sheet

MAGNETIC FIELD SENSOR

This nonprovisional application claims priority to German Patent Application No. DE 10 2012 024 062.7, which was filed in Germany on Dec. 10, 2012, and to U.S. Provisional Application No. 61/735,644, which was filed on Dec. 11, 2012, and which are both herein incorporated by reference.

BACKGROUND OF THE INVENTION

1. Field of the Invention

The invention relates to a magnetic field sensor.

2. Description of the Background Art

A support with a Hall plate is known from DE 202 11 518 U1, which corresponds to U.S. 20050231197. Furthermore, carbon-containing Hall plates are known from U.S. 20110037464 A1 and Hall plates made of group III-V elements from U.S. Pat. No. 5,162,885. Other Hall plates are known from U.S. Pat. No. 5,859,624 and DE 10 2005 051 306 A1, which corresponds to U.S. 20060097715.

SUMMARY OF THE INVENTION

It is therefore an object of the present invention to provide a device that refines the state of the art.

According to an embodiment of the invention, a magnetic field sensor having a support with a top side and a bottom side is provided, whereby a Hall plate is provided on the top side of the support and the Hall plate comprises a carbon-containing layer. It should be noted that the carbon-containing layer, which in a embodiment also has a plurality of layers, forms part of the Hall plate and the carbon-containing layer generates a Hall voltage. It is understood that a Hall plate generates a Hall voltage provided an operating current flows through the Hall plate and a portion of the magnetic flux penetrates the surface of the Hall plate vertically.

An advantage of the magnetic field sensor of the invention is that a carbon-containing layer can be produced simply and cost-effectively. Tests have shown that, because of the high mobility of the charge carriers in the carbon-containing layers in the case of small magnetic fluxes as well, a Hall voltage results and a sensitive magnetic field sensor can be produced.

In an embodiment, the carbon-containing layer can be formed as a Hall plate; i.e., the Hall plate is formed solely of the carbon-containing layer. Preferably, the ratio of the lateral dimension of the layer to the thickness of the layer is greater than 50.

In a further embodiment, the carbon-containing layer can be formed as a two-dimensional layer, so that a current flow occurs substantially only parallel to the layer plane. Tests have shown that a low-defect configuration with a high charge carrier mobility parallel to the plane of the carbon-containing layer brings about an especially high Hall voltage. The two dimensional-layer can comprise a range between 1 and 20 atomic layers, whereby the charge carrier transport occurs in one atomic layer or in a plurality of atomic layers. The two-dimensional layer can comprise at most precisely 1 atomic layer. Preferably, the charge carrier transport occurs only in one atomic layer.

It is preferable to connect the Hall plate electrically to a control unit, whereby in an embodiment the control unit is disposed on the support of the Hall plate. Further, it is preferable to dispose the control unit and the Hall plate in the same housing. It is preferable that the support is formed as a semiconductor substrate and particularly as a silicon substrate. It is advantageous in the case of a silicon substrate that the control unit is formed as an integrated circuit within the substrate. As a result, the control unit is monolithically integrated with the support, i.e., the silicon substrate. Further, the Hall plate is preferably formed above the passivation layer of the silicon substrate.

In an embodiment, two Hall plates or three Hall plates are provided on the support, whereby the Hall plates are preferably arranged orthogonal to one another. It is preferred to form a Hall plate parallel to the top side of the support.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

Figure 1:
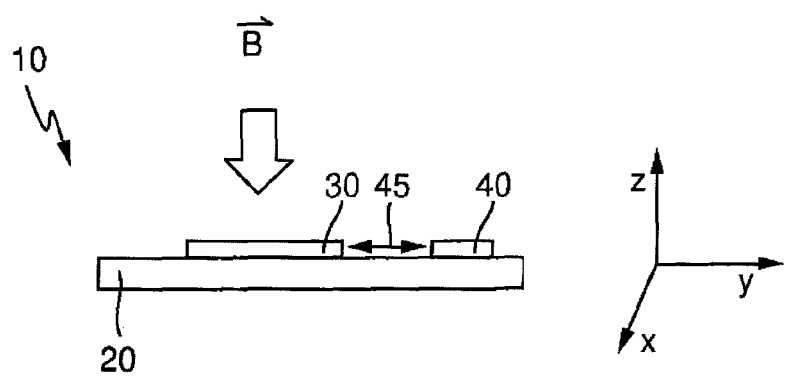
FIG. 1 shows a cross-sectional view of an embodiment of the invention of a magnetic field sensor.

The illustration in FIG. 1 shows a cross-sectional view of a first embodiment, having a magnetic field sensor 10 with a support 20 with a top side 24 and a bottom side 28, whereby a Hall plate 30 is provided on top side 24 of support 20. For the sake of clarity, a Cartesian coordinate system is shown. Hall plate 30 comprises a carbon-containing layer and is formed parallel to the x-y plane. It is preferred to make the entire Hall plate 30 out of the carbon-containing layer. A control unit 40 is disposed on top side 24 of support 20. Control unit 40 is electrically connected to Hall plate 30 and provides the operating current for Hall plate 30 by means of a connection 45. Further, the Hall voltage of Hall plate 30 is applied at control unit 40 by means of connection 45. Hall plate 30 is penetrated by a magnetic field B perpendicular to the plane of Hall plate 30.

In an embodiment that is not shown, control unit 40 and Hall plate 30 are disposed in the same housing. Further, in an embodiment that likewise is not shown, the carbon-containing layer is made especially thin, as so-called 2-dimensional layer. As a result, the current flow occurs substantially only parallel to the layer plane.

Figure 2:
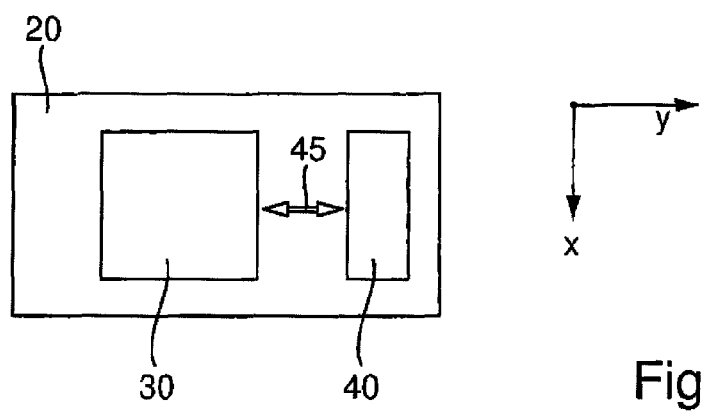
FIG. 2 shows a plan view of the embodiment of the invention, illustrated in the drawing of FIG. 1.

In the illustration in FIG. 2, a plan view of the first embodiment of the invention is shown which is depicted in the illustration of FIG. 1. Only the differences from the illustration in FIG. 1 will be explained below. Hall plate 30 has electrical terminal contacts on all four edges. The terminal contacts are each connected to control unit 40. Control unit 40 impresses an operating current by means of two terminal contacts and removes the Hall voltage with the two remaining terminal contacts.

Figure 3:
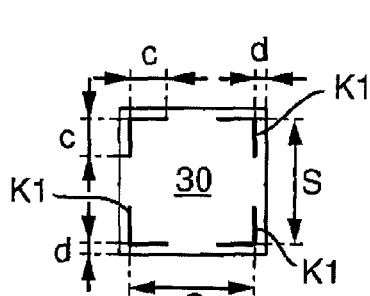
FIG. 3 shows a plan view of an embodiment of a Hall plate.

A plan view of a first embodiment of a Hall plate 30 is shown in the illustration of FIG. 3. Only the differences to the preceding embodiments will be described below. For the sake of clarity, support 20 and control unit 40 are not shown. Hall plate 30 is made as a square plate. The square plate has an edge length S. Contact angles K1 are arranged at a distance d to the particular edge of the plate in all four corners of the plate. Contact angles K1 each have two equally long legs with a length K1 and are electrically connected by means of connection 45 to control unit 40 (not shown).

Figure 4:
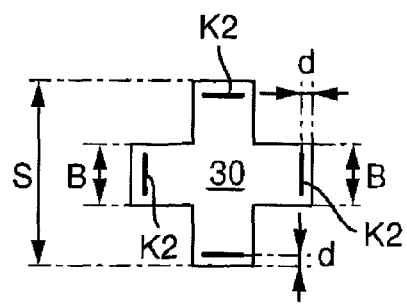
FIG. 4 shows a plan view of an embodiment of a Hall plate.

A plan view of a second embodiment of a Hall plate 30 is shown in the illustration of FIG. 4. Only the differences to the preceding embodiments will be described below. For the sake of clarity, support 20 and control unit 40 are not shown. In this case, Hall plate 30 is formed as a cross with a total length S and with four legs formed symmetric to one another. Each leg has a width B. A contact strip K2 with a width B and distance d to the edge is arranged at the respective outer end of each leg of the cross. In the particular longitudinal extension, contact strip K2 lies parallel to the outer edge of the respective leg. The four contact strips K2 are electrically connected by means of connection 45 to control unit 40 (not shown).

Figure 5:
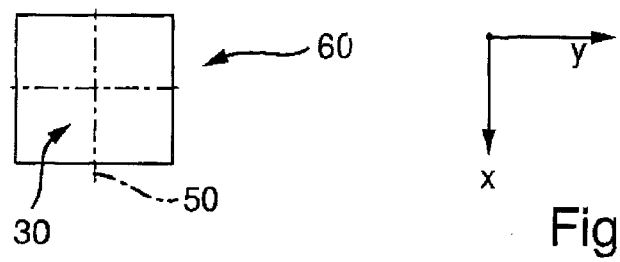
FIG. 5 shows a plan view of a three-dimensional Hall sensor.

A plan view of a three-dimensional Hall sensor is shown in the illustration of FIG. 5. Only the differences to the preceding embodiments will be described below. For the sake of clarity, support 20 and control unit 40 are not shown.

A further Hall plate 50 formed parallel to the x-z plane and an additional Hall plate 60 formed parallel to the y-z plane are provided in addition to Hall plate 30 formed parallel to the x-y plane. Because Hall plates 30, 50, and 60 are arranged orthogonal to one another, a magnetic field can be detected in all 3 spatial directions.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field sensor comprising:
   a support with a top side and a bottom side, the support being formed as a silicon substrate;
   a Hall plate arranged on the top side of the support; and
   a control unit monolithically integrated in the silicon substrate,
   wherein the Hall plate comprises a carbon-containing layer,
   wherein the Hall plate is formed above a passivation layer of the silicon substrate,
   wherein the Hall plate is electrically connected to the control unit, and
   wherein the control unit and the Hall plate are disposed in a same housing.

2. The magnetic field sensor according to claim 1, wherein the carbon-containing layer is formed as a Hall plate.

3. The magnetic field sensor according to claim 1, wherein the carbon-containing layer is formed as a two-dimensional layer so that a current flow occurs substantially only parallel to a layer plane.

4. The magnetic field sensor according to claim 1, wherein two Hall plates or three Hall plates are provided on the support.

5. The magnetic field sensor according to claim 4, wherein the Hall plates are arranged orthogonal to one another.

6. A magnetic field sensor comprising:
   a support with a top side and a bottom side, and comprising a passivation layer;
   a Hall plate arranged above the top side of the support above the passivation layer, the Hall plate comprising a carbon-containing layer; and
   a control unit, electrically connected to the Hall plate, arranged above the top side of the support.

7. The magnetic field sensor according to claim 6, wherein the support comprises a silicon substrate.

8. The magnetic field sensor according to claim 7, wherein the control unit is monolithically integrated with the silicon substrate.

9. The magnetic field sensor according to claim 6, wherein the Hall plate is formed solely of the carbon-containing layer.

10. The magnetic field sensor according to claim 6, wherein a ratio of a lateral dimension of the Hall plate to a thickness of the Hall plate is greater than 50.

11. The magnetic field sensor according to claim 6, wherein the carbon-containing layer is formed as a two-dimensional layer so that a current flow occurs substantially only parallel to a layer plane.

12. The magnetic field sensor according to claim 6, wherein two Hall plates or three Hall plates are provided on the support.

13. The magnetic field sensor according to claim 12, wherein the Hall plates are arranged orthogonal to one another.

14. The magnetic field sensor according to claim 6, further comprising a housing,
   wherein the Hall plate and the control unit are disposed within the housing.

* * * * *